United States Patent
Swillam et al.

(10) Patent No.: US 12,399,000 B2
(45) Date of Patent: Aug. 26, 2025

(54) SYSTEMS AND METHODS FOR MEASURING INTENSITY IN A LITHOGRAPHIC ALIGNMENT APPARATUS

(71) Applicant: ASML Holding N.V., Veldhoven (NL)

(72) Inventors: Mohamed Swillam, Wilton, CT (US); Justin Lloyd Kreuzer, Trumbull, CT (US); Stephen Roux, New Fairfield, CT (US); Michael Leo Nelson, Redding, CT (US); Muhsin Eralp, Bethel, CT (US)

(73) Assignee: ASML Holding N.V., Veldhoven (NL)

( * ) Notice: Subject to any disclaimer, the term of this patent is extended or adjusted under 35 U.S.C. 154(b) by 85 days.

(21) Appl. No.: 18/260,817

(22) PCT Filed: Jan. 4, 2022

(86) PCT No.: PCT/EP2022/050094
§ 371 (c)(1),
(2) Date: Jul. 10, 2023

(87) PCT Pub. No.: WO2022/157009
PCT Pub. Date: Jul. 28, 2022

(65) Prior Publication Data
US 2024/0077308 A1 Mar. 7, 2024

Related U.S. Application Data

(60) Provisional application No. 63/138,844, filed on Jan. 19, 2021.

(51) Int. Cl.
*G01B 11/27* (2006.01)
*G03F 7/20* (2006.01)

(52) U.S. Cl.
CPC .............. *G01B 11/272* (2013.01); *G03F 7/20* (2013.01)

(58) Field of Classification Search
CPC ...... G03F 7/20; G03F 7/70108; G01B 11/272
See application file for complete search history.

(56) References Cited

U.S. PATENT DOCUMENTS 6,297,876 B1  10/2001  Bornebroek
6,961,116 B2  11/2005  Den Boef et al.
(Continued)

FOREIGN PATENT DOCUMENTS

EP  1 628 164 A2  2/2006
TW  2017-30687 A  9/2017
(Continued)

OTHER PUBLICATIONS

International Search Report and Written Opinion of the International Searching Authority directed to International Patent Application No. PCT/EP2022/050094, mailed Apr. 19, 2022; 8 pages.
(Continued)

*Primary Examiner* — Kevin K Pyo
(74) *Attorney, Agent, or Firm* — Sterne, Kessler, Goldstein & Fox P.L.L.C.

(57) ABSTRACT

A metrology system includes a radiation source, an adjustable diffractive element, an optical system, an optical element, and a processor. The radiation source generates radiation. The adjustable diffractive element diffracts the radiation to generate first and second beams of radiation. The first and second beams have first and second different non-zero diffraction orders, respectively. The optical system directs the first and second beams toward a target structure such that first and second scattered beams of radiation are generated based on the first and second beams, respectively. The metrology system adjusts a phase difference of the first and second scattered beams. The optical element interferes the first and second scattered beams at an imaging detector that generates a detection signal. The processor receives and
(Continued)

analyzes the detection signal to determine a property of the target structure based on the adjusted phase difference.

20 Claims, 10 Drawing Sheets

(56) References Cited

U.S. PATENT DOCUMENTS

| | | |
|---|---|---|
| 7,511,799 B2 | 3/2009 | Tel et al. |
| 8,706,442 B2 | 4/2014 | Mos et al. |
| 10,416,577 B2 | 9/2019 | Brinkhof et al. |
| 2009/0195768 A1 | 8/2009 | Bijnen et al. |
| 2011/0310388 A1 | 12/2011 | Hill et al. |
| 2020/0209608 A1 | 7/2020 | Beukman et al. |
| 2022/0074875 A1 | 3/2022 | Mathijssen et al. |
| 2022/0350268 A1 | 11/2022 | Elazhary et al. |
| 2025/0028258 A1* | 1/2025 | Voznyi .................. G03F 9/7084 |

FOREIGN PATENT DOCUMENTS

| | | |
|---|---|---|
| TW | 2021-02944 A | 1/2021 |
| TW | 2021-22934 A | 6/2021 |
| WO | WO 97/45773 A1 | 12/1997 |
| WO | WO 2016/005167 A1 | 1/2016 |
| WO | WO 2020/141050 A1 | 7/2020 |
| WO | WO 2020/239516 A1 | 12/2020 |

OTHER PUBLICATIONS

Niu et al., "Specular Spectroscopic Scatterometry in DUV Lithography," Proc. SPIE, vol. 3677, Metrology, Inspection, and Process Control for Microlithography XIII, Jun. 14, 1999; 10 pages.

Raymond et al., "Multiparameter grating metrology using optical scatterometry," Journal of Vacuum Science & Technology B: Microelectronics and Nanometer Structures Processing, Measurement, and Phenomena, vol. 15, Mar. 1, 1997; pp. 361-368.

* cited by examiner

SYSTEMS AND METHODS FOR MEASURING INTENSITY IN A LITHOGRAPHIC ALIGNMENT APPARATUS

CROSS-REFERENCE TO RELATED APPLICATIONS

This application claims priority of U.S. Provisional Patent Application No. 63/138,844, which was filed on Jan. 19, 2021, and which is incorporated herein in its entirety by reference.

FIELD

The present disclosure relates to a metrology system, for example, an alignment apparatus for measuring a position of a feature on a substrate in lithographic systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Errors in alignment of wafers in a lithographic apparatus result in reduced quality, unreliable performance, and reduced yield rates of fabricated devices, which in turn increases time and cost of fabrication of devices.

SUMMARY

Accordingly, it is desirable to improve metrology techniques that allow for more accurate placement of lithographed structures on wafers.

In some embodiments, a metrology system comprises a radiation source configured to generate a radiation beam, an optical system configured to direct the radiation beam toward a target structure, and receive a first scattered beam and a second scattered beam of radiation from the target structure, wherein the first scattered beam comprises a first non-zero diffraction order and the second scattered beam comprises a second non-zero diffraction order that is different from the first non-zero diffraction order. The system further includes an optical element. The optical element is configured to direct the first scattered beam towards an imaging detector and blocking the second scattered beam. The optical element is also configured to direct the second scattered beam towards the imaging detector and blocking the first scattered beam. The imaging detector is then configured to determine a first intensity signal of the first scattered beam, determine a second intensity signal of the second scattered beam, and generate a detection signal corresponding to a difference between the first intensity signal and the second intensity signal. The metrology system also includes a processor configured to determine a property of the target structure based on at least the detection signal Further features of the present disclosure, as well as the structure and operation of various embodiments, are described in detail below with reference to the accompanying drawings. It is noted that the present disclosure is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable a person skilled in the relevant art(s) to make and use embodiments described herein.

FIG. 1A shows a schematic of a reflective lithographic apparatus, according to some embodiments.

Figure 1A:
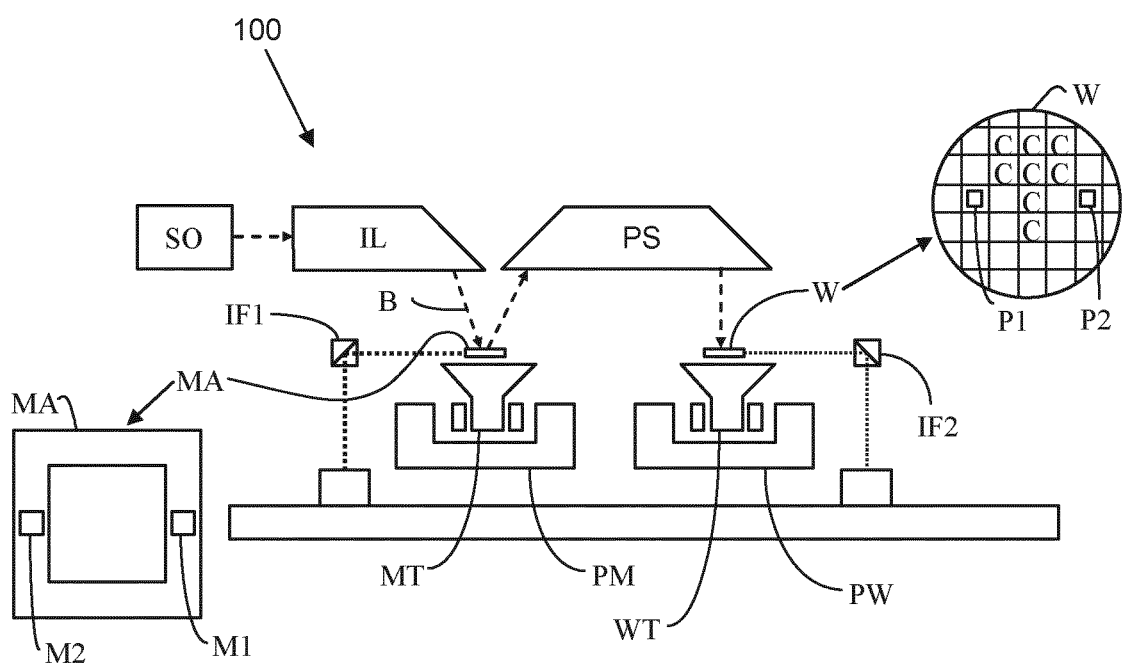
FIG. 1B shows a schematic of a transmissive lithographic apparatus, according to some embodiments.

The features of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) are provided as examples. The scope of the present disclosure is not limited to the disclosed embodiment(s). Claimed features are defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
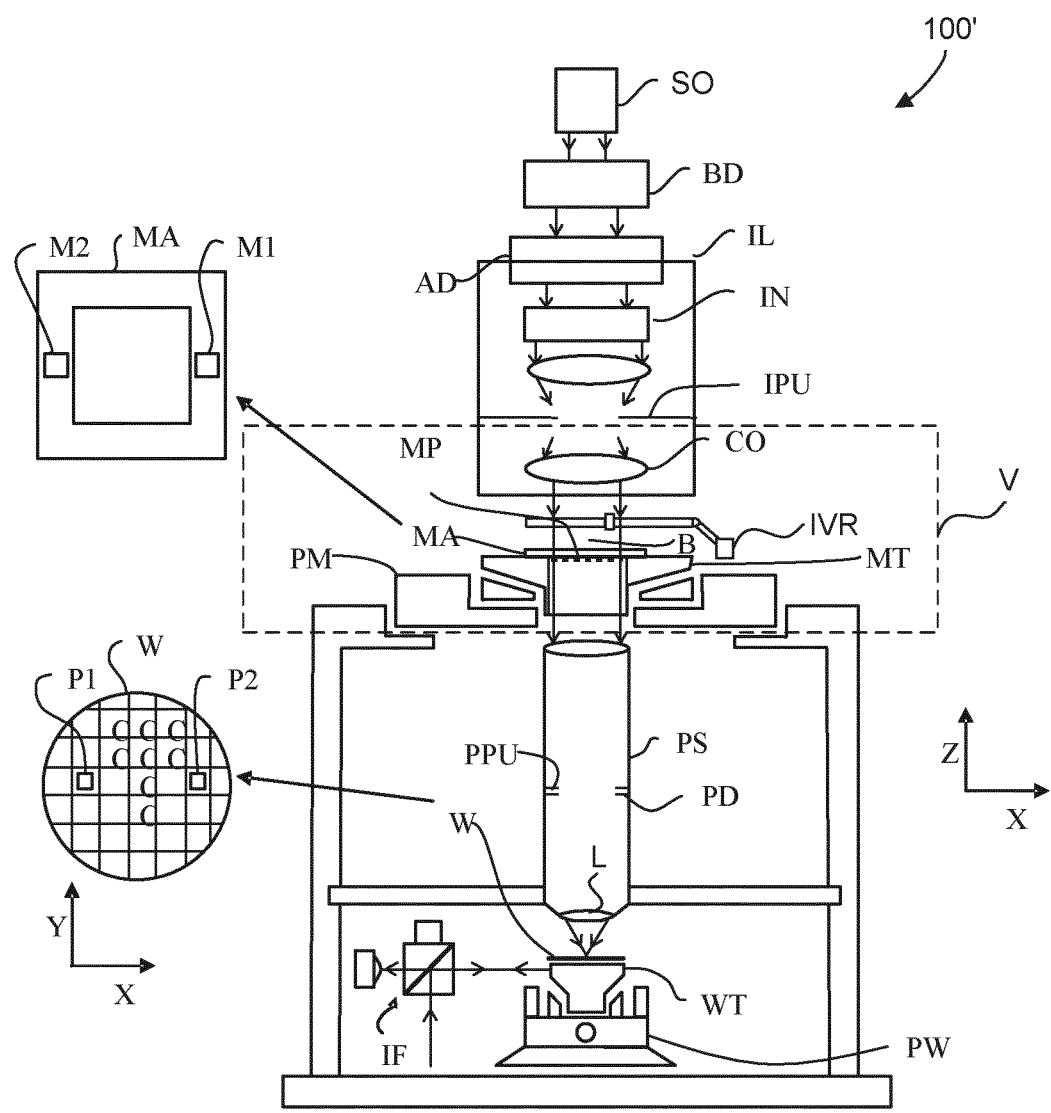

FIGS. 1A and 1B show schematic illustrations of a lithographic apparatus 100 and lithographic apparatus 100', respectively, in which embodiments of the present disclosure can be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL can include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The terms "inspection apparatus," "metrology apparatus," and the like may be used herein to refer to, e.g., a device or system used for measuring a property of a structure (e.g., overlay error, critical dimension parameters) or used in a lithographic apparatus to inspect an alignment of a wafer (e.g., alignment apparatus).

The patterning device MA can be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus can also be of a type wherein at least a portion of the substrate can be covered by a liquid having a relatively high refractive index, e.g., water, so as to fill a space between the projection system and the substrate. An immersion liquid can also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image of the mask pattern MP, where the image is formed by diffracted beams produced from the mark pattern MP by radiation from the intensity distribution, onto a photoresist layer coated on the substrate W. For example, the mask pattern MP can include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration can be reduced by providing radiation poles (not shown) in opposite quadrants of the illumination system pupil IPU. Further, in some embodiments, astigmatism aberration can be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.
2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.
3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
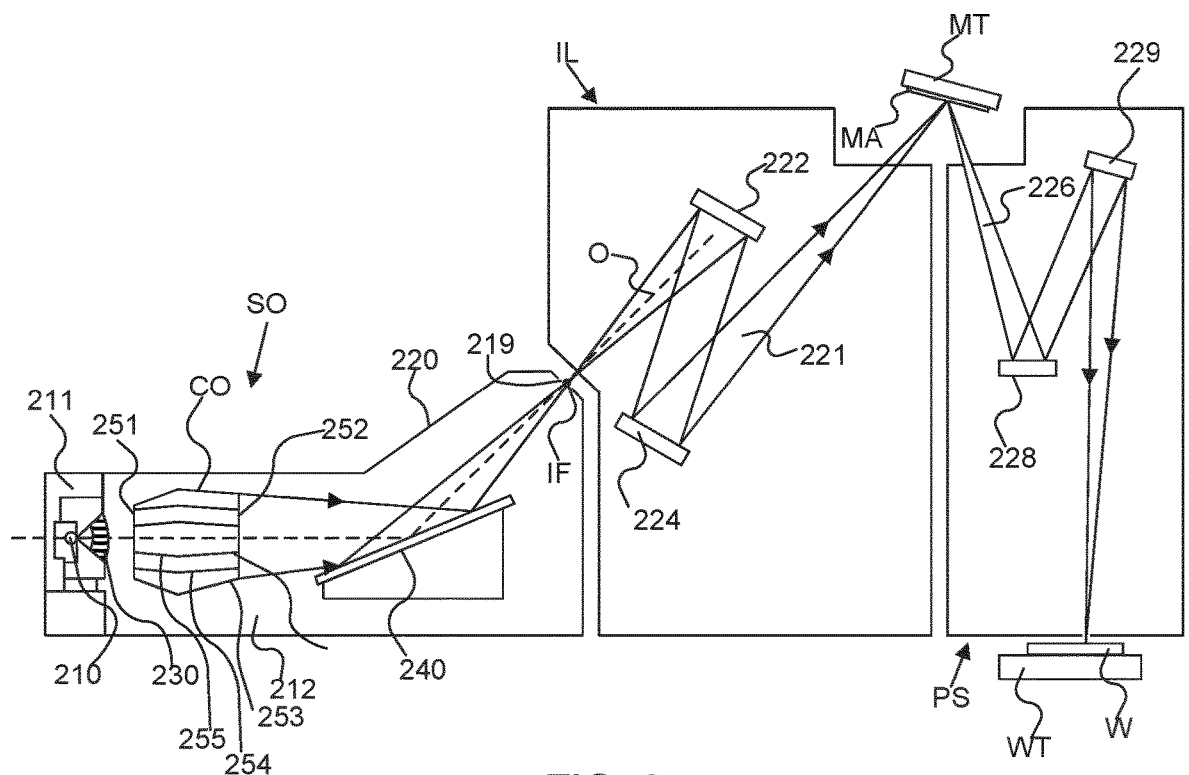
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation can be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor can be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure.

The collector chamber 212 can include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination optics unit IL and projection system PS. The grating spectral filter 240 can optionally be present, depending upon the type of lithographic apparatus. Further, there can be more mirrors present than those shown in the FIG. 2, for example there can be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
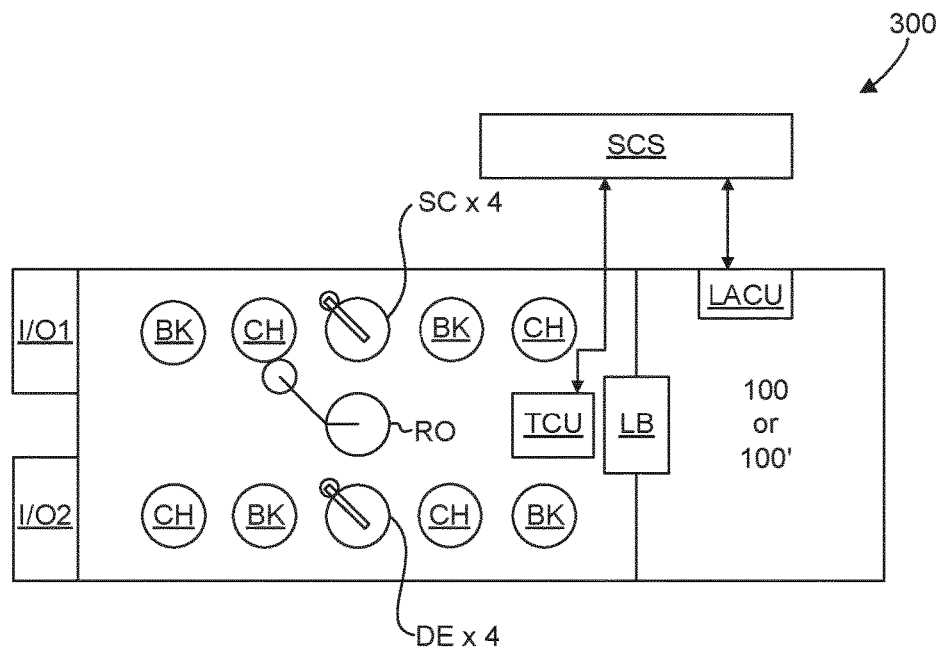
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' can form part of lithographic cell 300. Lithographic cell 300 can also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Inspection Apparatus

In order to control the lithographic process to place device features accurately on the substrate, alignment marks are generally provided on the substrate, and the lithographic apparatus includes one or more alignment apparatuses and/ or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement can be performed using the techniques described in U.S. Publication No. 2009/195768 A (Bijnen et al.), however. The full contents of both of these disclosures are incorporated herein by reference.

Figure 4A:
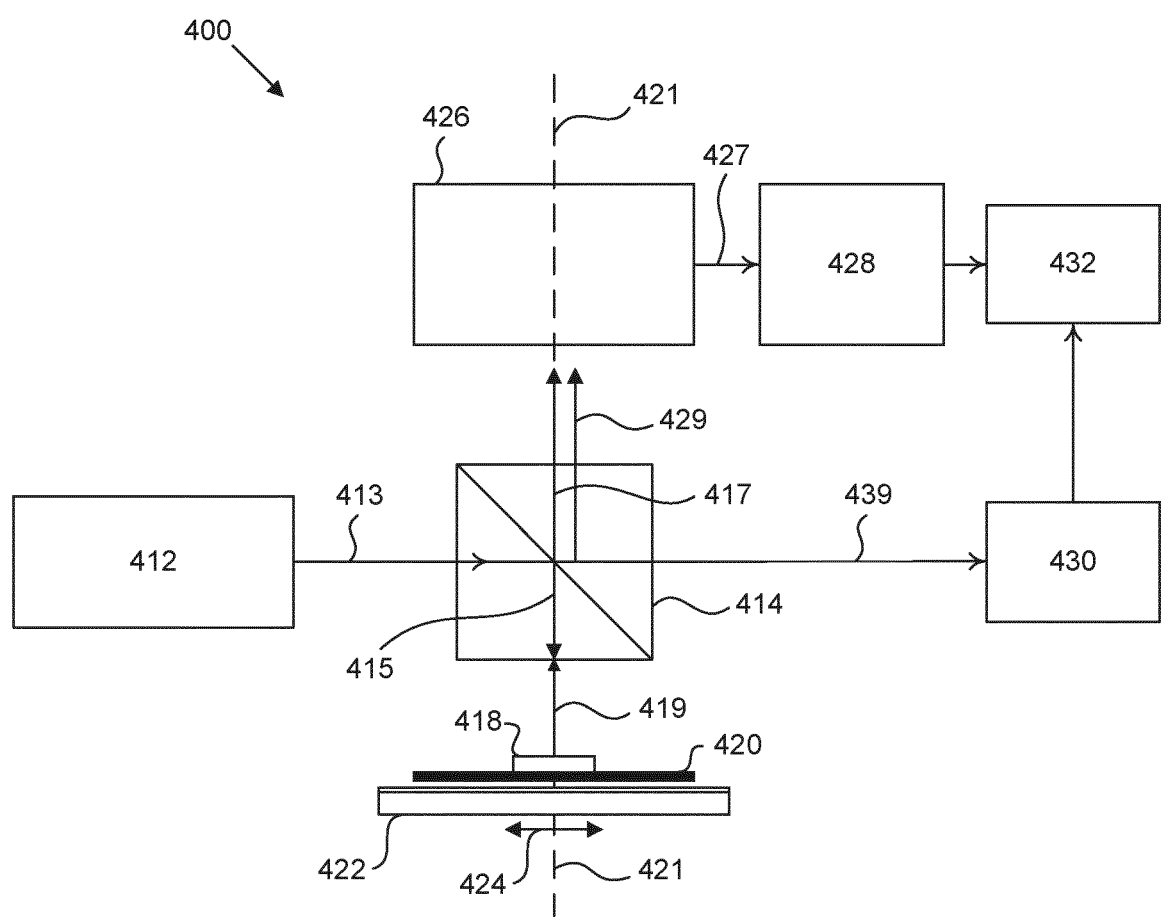
FIGS. 4A and 4B show schematics of inspection apparatuses, according to some embodiments.

FIG. 4A shows a schematic of a cross-sectional view of an inspection apparatus 400 that can be implemented as a part of lithographic apparatus 100 or 100', according to some embodiments. In some embodiments, inspection apparatus 400 can be configured to align a substrate (e.g., substrate W) with respect to a patterning device (e.g., patterning device MA). Inspection apparatus 400 can be further configured to detect positions of alignment marks on the substrate and to align the substrate with respect to the patterning device or other components of lithographic apparatus 100 or 100' using the detected positions of the alignment marks. Such alignment of the substrate can ensure accurate exposure of one or more patterns on the substrate.

In some embodiments, inspection apparatus 400 can include an illumination system 412, a beam splitter 414, an interferometer 426, a detector 428, a beam analyzer 430, and an overlay calculation processor 432. Illumination system 412 can be configured to provide an electromagnetic narrow band radiation beam 413 having one or more passbands. In an example, the one or more passbands can be within a spectrum of wavelengths between about 500 nm to about 900 nm. In another example, the one or more passbands can be discrete narrow passbands within a spectrum of wavelengths between about 500 nm to about 900 nm. Illumination system 412 can be further configured to provide one or more passbands having substantially constant center wavelength (CWL) values over a long period of time (e.g., over a lifetime of illumination system 412). Such configuration of illumination system 412 can help to prevent the shift of the actual CWL values from the desired CWL values, as discussed above, in current alignment systems. And, as a result, the use of constant CWL values can improve long-term stability and accuracy of alignment systems (e.g., inspection apparatus 400) compared to the current alignment apparatuses.

In some embodiments, beam splitter 414 can be configured to receive radiation beam 413 and split radiation beam 413 into at least two radiation sub-beams. For example, radiation beam 413 can be split into radiation sub-beams 415 and 417, as shown in FIG. 4A. Beam splitter 414 can be further configured to direct radiation sub-beam 415 onto a substrate 420 placed on a stage 422. In one example, the stage 422 is movable along direction 424. Radiation sub-beam 415 can be configured to illuminate an alignment mark or a target 418 located on substrate 420. Alignment mark or target 418 can be coated with a radiation sensitive film. In some embodiments, alignment mark or target 418 can have one hundred and eighty degrees (i.e., 180°) symmetry. That is, when alignment mark or target 418 is rotated 180° about an axis of symmetry perpendicular to a plane of alignment mark or target 418, rotated alignment mark or target 418 can be substantially identical to an unrotated alignment mark or target 418. The target 418 on substrate 420 can be (a) a resist layer grating comprising bars that are formed of solid resist lines, or (b) a product layer grating, or (c) a composite grating stack in an overlay target structure comprising a resist grating overlaid or interleaved on a product layer grating. The bars can alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, can be input to the reconstruction process, performed by processing unit PU, from knowledge of the printing step and/or other scatterometry processes.

In some embodiments, beam splitter 414 can be further configured to receive diffraction radiation beam 419 and split diffraction radiation beam 419 into at least two radiation sub-beams, according to an embodiment. Diffraction radiation beam 419 can be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements can be used to obtain the similar result of illuminating alignment mark or target 418 on substrate 420 and detecting an image of alignment mark or target 418.

As illustrated in FIG. 4A, interferometer 426 can be configured to receive radiation sub-beam 417 and diffracted radiation sub-beam 429 through beam splitter 414. In an example embodiment, diffracted radiation sub-beam 429 can be at least a portion of radiation sub-beam 415 that can be reflected from alignment mark or target 418. In an example of this embodiment, interferometer 426 comprises any appropriate set of optical-elements, for example, a combination of prisms that can be configured to form two images of alignment mark or target 418 based on the received diffracted radiation sub-beam 429. It should be appreciated that a good quality image need not be formed, but that the features of alignment mark 418 should be resolved. Interferometer 426 can be further configured to rotate one of the two images with respect to the other of the two images 180° and recombine the rotated and unrotated images interferometrically.

In some embodiments, detector 428 can be configured to receive the recombined image via interferometer signal 427 and detect interference as a result of the recombined image when alignment axis 421 of inspection apparatus 400 passes through a center of symmetry (not shown) of alignment mark or target 418. Such interference can be due to alignment mark or target 418 being 180° symmetrical, and the recombined image interfering constructively or destructively, according to an example embodiment. Based on the detected interference, detector 428 can be further configured to determine a position of the center of symmetry of alignment mark or target 418 and consequently, detect a position of substrate 420. According to an example, alignment axis 421 can be aligned with an optical beam perpendicular to substrate 420 and passing through a center of image rotation interferometer 426. Detector 428 can be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can be obtained, for example, with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 can be configured to receive and determine an optical state of diffracted radiation sub-beam 439. The optical state can be a measure of beam wavelength, polarization, or beam profile. Beam analyzer 430 can be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 can be configured to determine a position of inspection apparatus 400 or any other reference element such that the center of symmetry of alignment mark or target 418 can be known with reference to inspection apparatus 400 or any other reference element. Beam analyzer 430 can be a point or an imaging polarimeter with some form of wavelength-band selectivity. In some embodiments, beam analyzer 430 can be directly integrated into inspection apparatus 400, or connected via fiber optics of several types: polarization preserving single mode, multimode, or imaging, according to other embodiments.

In some embodiments, beam analyzer 430 can be further configured to determine the overlay data between two patterns on substrate 420. One of these patterns can be a reference pattern on a reference layer. The other pattern can be an exposed pattern on an exposed layer. The reference layer can be an etched layer already present on substrate 420. The reference layer can be generated by a reference pattern exposed on the substrate by lithographic apparatus 100 and/or 100'. The exposed layer can be a resist layer exposed adjacent to the reference layer. The exposed layer can be generated by an exposure pattern exposed on substrate 420 by lithographic apparatus 100 or 100'. The exposed pattern on substrate 420 can correspond to a movement of substrate 420 by stage 422. In some embodiments, the measured overlay data can also indicate an offset between the reference pattern and the exposure pattern. The measured overlay data can be used as calibration data to calibrate the exposure pattern exposed by lithographic apparatus 100 or 100', such that after the calibration, the offset between the exposed layer and the reference layer can be minimized.

In some embodiments, beam analyzer 430 can be further configured to determine a model of the product stack profile of substrate 420, and can be configured to measure overlay, critical dimension, and focus of target 418 in a single measurement. The product stack profile contains information on the stacked product such as alignment mark, target 418, or substrate 420, and can include mark process variation-induced optical signature metrology that is a function of illumination variation. The product stack profile can also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 can be further configured to process information related to a particular property of an exposed pattern in that layer. For example, beam analyzer 430 can process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) can be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
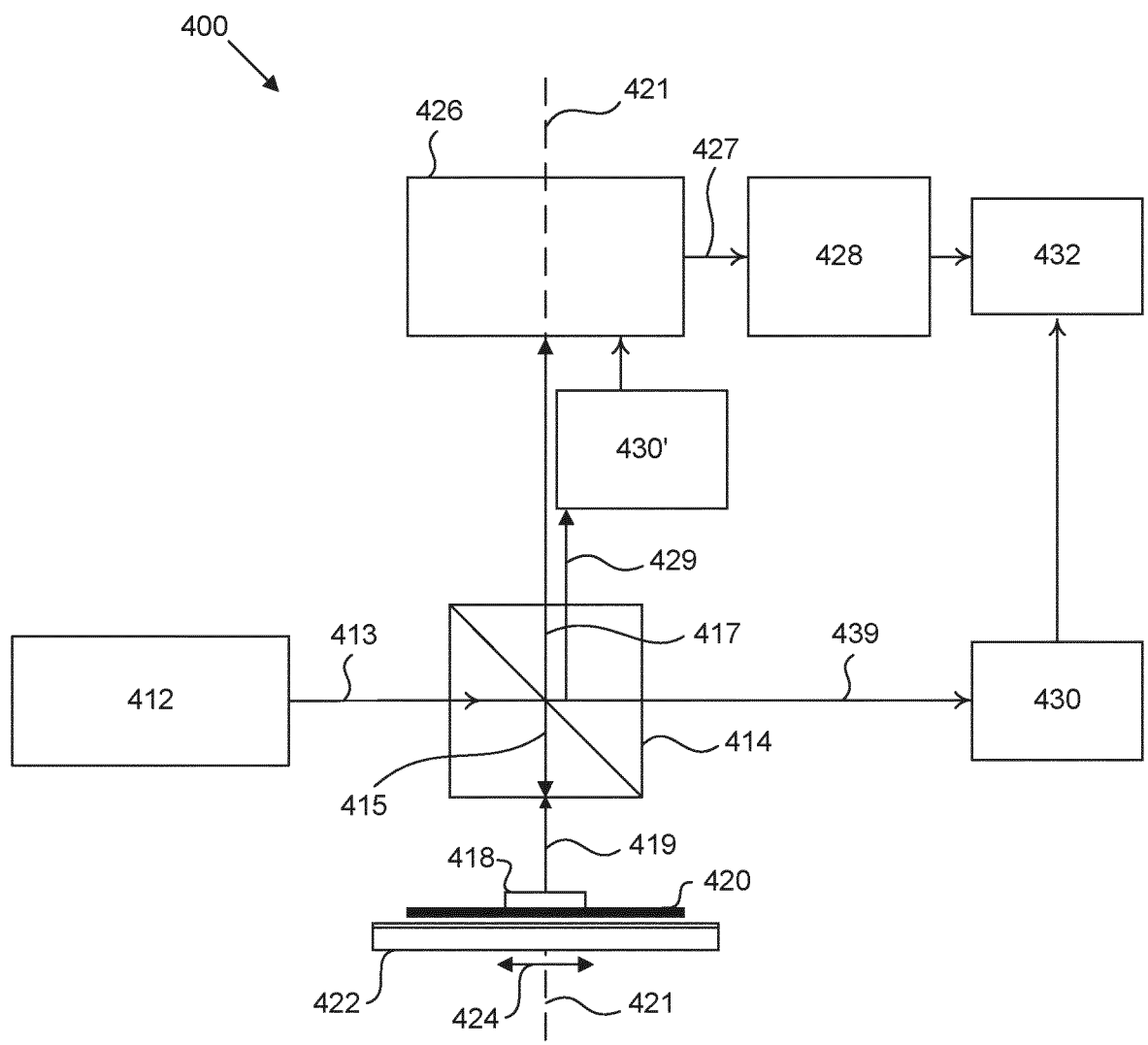

In some embodiments, a second beam analyzer 430' can be configured to receive and determine an optical state of diffracted radiation sub-beam 429, as shown in FIG. 4B. The optical state can be a measure of beam wavelength, polarization, or beam profile. Second beam analyzer 430' can be identical to beam analyzer 430. Alternatively, second beam analyzer 430' can be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' can also be configured to determine a position of inspection apparatus 400, or any other reference element, such that the center of symmetry of alignment mark or target 418 can be known with reference to inspection apparatus 400, or any other reference element. Second beam analyzer 430' can be further configured to determine the overlay data between two patterns and a model of the product stack profile of substrate 420. Second beam analyzer 430' can also be configured to measure overlay, critical dimension, and focus of target 418 in a single measurement.

In some embodiments, second beam analyzer 430' can be directly integrated into inspection apparatus 400, or it can be connected via fiber optics of several types: polarization preserving single mode, multimode, or imaging, according to other embodiments. Alternatively, second beam analyzer 430' and beam analyzer 430 can be combined to form a single analyzer (not shown) configured to receive and determine the optical states of both diffracted radiation sub-beams 429 and 439.

In some embodiments, processor 432 receives information from detector 428 and beam analyzer 430. For example, processor 432 can be an overlay calculation processor. The information can comprise a model of the product stack profile constructed by beam analyzer 430. Alternatively, processor 432 can construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 can create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 can utilize the basic correction algorithm to characterize the inspection apparatus 400 with reference to wafer marks and/or alignment marks 418.

In some embodiments, processor 432 can be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 can utilize a clustering algorithm to group the marks into sets of similar constant offset error, and create an alignment error offset correction table based on the information. The clustering algorithm can be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this can be performed. The smallest measured overlay in the example shown is −1 nm. However this is in relation to a target with a programmed overlay of −30 nm. Consequently the process must have introduced an overlay error of 29 nm.

TABLE 1

| | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, can be determined and selected. Following this, processor 432 can group marks into sets of similar overlay error. The criteria for grouping marks can be adjusted based on different process controls, for example, different error tolerances for different processes.

In some embodiments, processor 432 can confirm that all or most members of the group have similar offset errors, and apply an individual offset correction from the clustering algorithm to each mark, based on its additional optical stack metrology. Processor 432 can determine corrections for each mark and feed the corrections back to lithographic apparatus 100 or 100' for correcting errors in the overlay, for example, by feeding corrections into the inspection apparatus 400.

Exemplary Alignment Sensor Apparatus Using a Blocking Optical Element

As discussed above, on-process accuracy errors (OPAEs) are caused by varying stack thicknesses, materials, and/or processes on each wafer (i.e., process variations) and overlay errors due to the interaction between alignment sensors. Process variations change the optical properties of reflected light from an alignment mark on a substrate, which causes OPAEs. Despite various techniques, such as mark asymmetry reconstruction (MAR), which corrects for asymmetries in an alignment mark, improved sensors (e.g., SMASH), and predictive modeling, wafer stack properties variations (i.e., process variations) cause a lower limit for OPAEs and cannot be reduced further using current techniques and systems. Process variations interact with an alignment sensor and create an alignment position error (APE) that cannot be calibrated.

APE is a change or shift in alignment position from a reference alignment position (e.g., calibrated alignment mark on a substrate). However, APE is a function of various physical parameters, for example, beam wavelength, spectral bandwidth, numerical aperture, beam intensity, beam spot size, beam shape, beam pattern, intensity imbalance, and/or polarization. For example, APE may be modeled as a linear function for one or more physical parameters. When physical parameters are varied in an alignment and/or lithographic apparatus, a change or shift in the reference alignment position due to unknown process variations can be measured and a correction can be determined and applied in order to reduce OPAEs.

Moreover, as overlay specifications are pushed to smaller numbers, process related errors, such as mark asymmetry, becomes more significant and requires correction. One way to detect mark asymmetry is to measure intensity imbalance between positive and negative diffraction orders. This may be done using, for example, mark phase information that corresponds to a position on a wafer. Another way may be picking off a small part of diffracted signal and guiding it through a designated optical path and detection optics. Due to complexity and calibration problems, however, an alternative approach that uses a common path for both diffracted intensity and phase of mark is highly desirable. For example, there would be a need to use a power splitting element and two complete detection systems that would be cumbersome and expensive.

Figure 5:
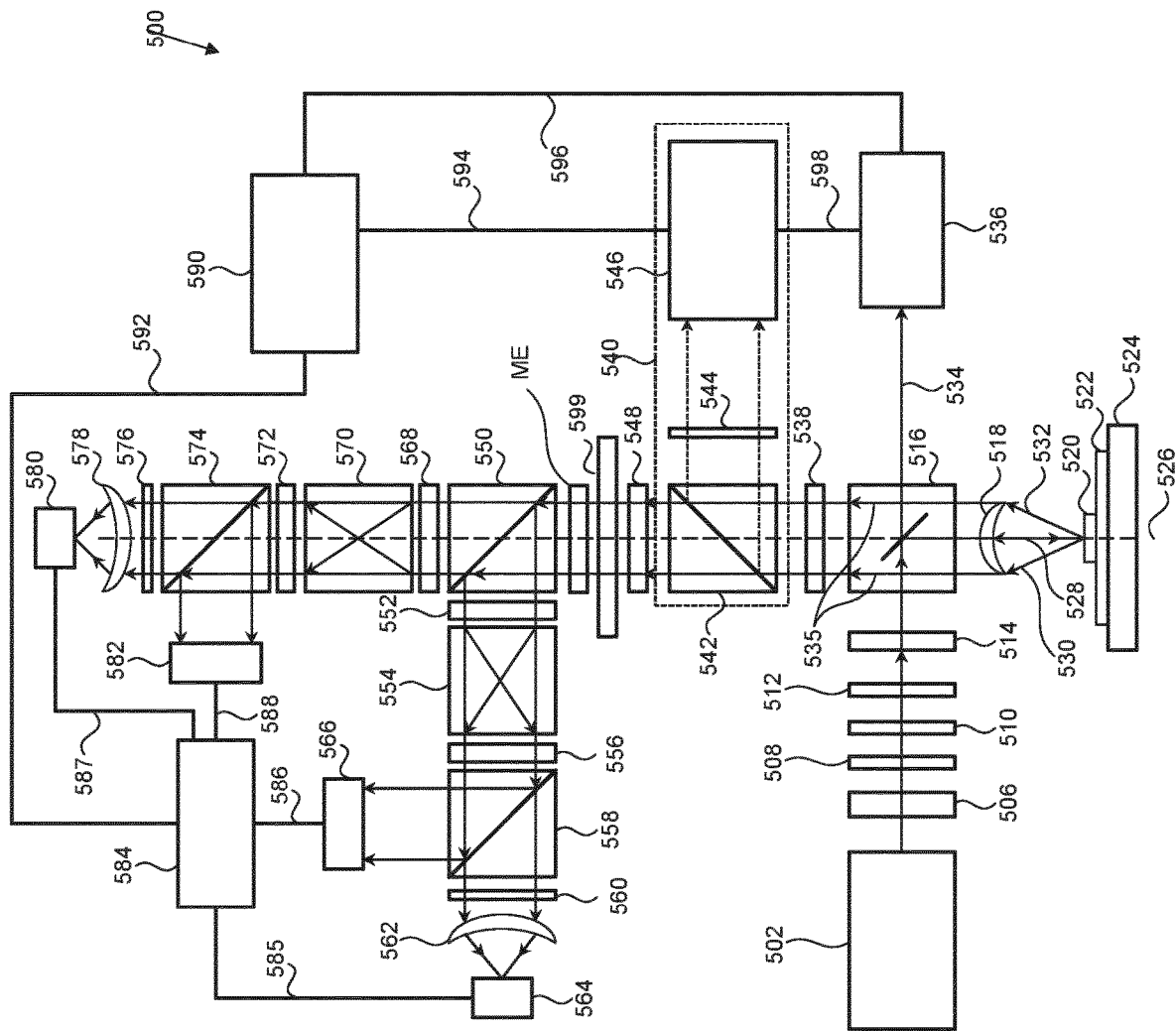
FIG. 5 is a schematic illustration of an alignment sensor apparatus, according to some embodiments.

A proposed implementation to reduce such system complexity is illustrated in FIG. 5, which deploys a blocking optical element, e.g., a shutter, in front of the diffracted orders to block one at a time while allowing the other to pass through. This enables the use of the same detection system without further hardware modifications that can add weight, complexities, and size to the alignment system.

FIG. 5 illustrates alignment sensor apparatus 500, according to an exemplary embodiment. Alignment sensor apparatus 500 is configured to improve overlay, for example, in lithographic apparatus 100 or 100' by allowing for the separate measurement of the phase and intensity of a mark. Alignment sensor apparatus 500 can include illumination system 502, spot mirror 516, focusing lens 518, polarizing beam splitter A, detector controller 584, one or more optical filters 506, 508, 510, 512, 514, 538, 548, 560, 576, and processor 590. Although alignment sensor apparatus 500 is shown in FIG. 5 as a stand-alone apparatus, the embodiments of this disclosure are not limited to this example, and alignment sensor apparatus 500 embodiments of this disclosure can be used with other optical systems, such as, but not limited to, lithographic apparatus 100 and/or 100', lithocell 300, alignment apparatus 400, and/or other optical systems.

Illumination system 502 can be configured to transmit illumination beam 504 along an illumination path toward spot mirror 516. According to some aspects, illumination system 502 can be similar to illumination system 412 described in FIGS. 4A and 4B. For example, illumination system 502 can include an extreme ultraviolet (EUV) source, which is configured to generate a beam of EUV radiation. Illumination system 502 can include a EUV source in a radiation system and a corresponding conditioning system configured to condition the EUV radiation beam of the EUV source.

Illumination system 502 can be configured to provide an electromagnetic narrow band illumination beam 504 having one or more passbands. In an example, the one or more passbands may be within a spectrum of wavelengths between about 500 nm to about 900 nm. In an example, the one or more passbands may be within a spectrum of wavelengths between about 10 nm to about 500 nm. In another example, the one or more passbands may be discrete narrow passbands within a spectrum of wavelengths between about 500 nm to about 900 nm. In another example, the one or more passbands may be discrete narrow passbands within a spectrum of wavelengths between about 10 nm to about 500 nm. Illumination system 502 can be further configured to provide one or more passbands having substantially constant center wavelength (CWL) values over a long period of time (e.g., over a lifetime of illumination system 502). Such configuration of illumination system 502 can help to prevent the shift of the actual CWL values from the desired CWL values, as discussed above, in current alignment systems. And, as a result, the use of constant CWL values may improve long-term stability and accuracy of alignment systems (e.g., alignment sensor apparatus 500) compared to the current alignment apparatuses.

In some embodiments, illumination system 502 can use a broadband light source (i.e., one with a wide range of light frequencies or wavelengths—and, thus, of colors) for a radiation source that may give a large etendue (i.e., spread of light, e.g., the product of the area (A) of the source and the solid angle (Ω) that the system's entrance pupil subtends as seen from the source), allowing the mixing of multiple wavelengths. In some embodiments, illumination beam 504 can include a plurality of wavelengths in the broadband preferably may each have a bandwidth of $\Delta\lambda$ and a spacing of at least $2\Delta\lambda$ (i.e., twice the bandwidth). In some embodiments, illumination system 502 can include several "sources" of radiation for different portions of an extended radiation source that have been split using fiber bundles. In this way, angle resolved scatter spectra can be measured at multiple wavelengths in parallel. For example, a 3-D spectrum (wavelength and two different angles) can be measured, which contains more information than a 2-D spectrum. This allows more information to be measured, which increases metrology process robustness. This is described in more detail in EP 1628164 A2, which is incorporated by reference herein in its entirety.

Spot mirror 516 is a transmissive cube with a reflective metal layer disposed in the center of the cube. As shown in FIG. 5, spot mirror 516 can form a 45° angle with the illumination path in order to direct illumination beam 504 toward substrate 522. In an embodiment, spot mirror 516 can be a beam splitter configured to reflect a first portion (e.g., 50%) of illumination beam 504 toward substrate 522 and transmit a second portion (e.g., 50%) of illumination beam 504 toward beam analyzer 536. Beam analyzer 536 is similar to beam analyzer 430 described in FIGS. 4A and 4B, and is configured to analyze various properties of illumination beam 504, for example, intensity, beam shape, alignment position, and/or polarization.

As shown in FIG. 5, spot mirror 516 can transmit illumination beam 504 toward focusing lens 518, which focuses illumination beam 504 on diffraction target 520 on substrate 522. In an embodiment, diffraction target 520 can be an alignment mark. In an embodiment, substrate 522 is supported by stage 524 and centered along alignment axis 526. In some embodiments, diffraction target 520 on substrate 522 can be a 1-D grating, which is printed such that after development, bars are formed of solid resist lines. In some embodiments, diffraction target 520 can be a 2-D array or grating, which is printed such that, after development, a grating is formed of solid resist pillars or vias in the resist. For example, bars, pillars, or vias may alternatively be etched into substrate 522.

Focused illumination beam 504 on diffraction target 520 creates a signal beam along signal path 535 comprising diffraction order sub-beams 528, 530, 532 reflected from diffraction target 520. As shown in FIG. 5, first diffraction order sub-beam 528, second diffraction order sub-beam 530, and third diffraction order sub-beam 532 reflect off diffraction target 520 back toward focusing lens 518 and create signal path 535. In some embodiments, focusing lens 518 can be positioned at the pupil plane. The pupil plane is the plane in which the radial position of radiation defines the angle of incidence and the angular position defines the azimuth angle of the radiation.

In some embodiments, first diffraction order sub-beam 528 can be a zeroth diffraction order sub-beam, second diffraction order sub-beam 530 can be a first diffraction order sub-beam (e.g., −1), and third diffraction order sub-beam 532 can be a first diffraction order sub-beam (e.g., +1). As shown in FIG. 5, spot mirror 516 blocks and/or reflects first diffraction order sub-beam 528 and transmits second and third diffraction order sub-beams 530, 532 along signal path 535. In some embodiments, spot mirror 516 reflects first diffraction order sub-beam 528 toward beam analyzer 536, which is configured to analyze various properties of first diffraction order sub-beam 528, for example, intensity, beam shape, alignment position, and/or polarization.

Second and third diffraction order sub-beams 530, 532 transmit along signal path 535 to polarizing beam splitter 550 configured to separate and transmit second and third diffraction order sub-beams 530, 532 into a first polarization optical branch (e.g. "X" direction, s-polarized) and a second polarization optical branch (e.g., "Y" direction, p-polarized) based on the polarization of sub-beams 530, 532. Polarized radiation with its electric field along the plane of incidence is deemed p-polarized (i.e., transverse-magnetic (TM)), while polarized radiation with its electric field normal to the plane of incidence is deemed s-polarized (i.e., transverse-electric (TE)). Polarizing beam splitter 550 splits signal path 535 into orthogonal polarization components (i.e., first and second polarization optical branches), and transmits s-polarized sub-beams 530, 532 into first polarization optical branch ("X" direction, s-polarized) and transmits p-polarized sub-beams 530, 532 into second polarization optical branch ("Y" direction, p-polarized).

First polarization optical branch is configured to transmit s-polarized sub-beams 530, 532 and measure any change, shift, and/or deviation in an alignment position of diffraction target 520 in a horizontal or "X" direction, with reference to alignment axis 526. As shown in FIG. 5, first polarization optical branch may include first polarizing filter 552, "X" direction self-referencing interferometer (SRI-X) 554, second polarizing filter 556, and polarizing beam splitter 558. S-polarized sub-beams 530, 532 transmit through first polarizing filter 552, SRI-X 554, and second polarizing filter 556 in order. In some embodiments, first and second polarizing filters 552, 556 can each be a waveplate, for example, a half-wave plate at 22.5° ($\pi/8$). In some embodiments, first and second polarizing filters 552, 556 can each be a waveplate, for example, a quarter-wave plate at 45° ($\pi/4$).

A half-wave plate induces a phase shift of 180° ($\pi$) and rotates a polarization angle $\theta$, formed between the polarization vector and the fast axis vector, to $-\theta$. For linearly polarized light, a half-wave plate rotates $\theta$ to $2\theta$, while for elliptically (e.g., circularly) polarized light, a half-wave plate inverts the chirality (e.g., from right-circular to left-circular). A quarter-wave plate induces a phase shift of 90° ($\pi/2$) and the output depends upon an input polarization angle $\varphi$, formed between the fast and slow axis vectors. For linearly polarized light, $\varphi=0°$ produces no change in the linear polarization, $\varphi=45°$ produces circular polarization, and $0°<\varphi<45°$ produces elliptical polarization.

First polarizing filter 552, SRI-X 554, and second polarizing filter 556 are configured to rotate an image of s-polarized sub-beams 530, 532 by 180° and recombine the two images, which are 180° out of phase with the other. The two recombined images are transmitted to polarizing beam splitter 558. Polarizing beam splitter 558 is configured to separate and transmit the difference between the two recombined images into first position detector 566 and the sum of the two recombined images into second position detector 564. As shown in FIG. 5, focusing lens 562 can be included in first polarization optical branch in order to focus the sum of the two recombined images onto second position detector 564. In some embodiments, an additional focusing lens, similar to focusing lens 562, may be included between first position detector 566 and polarizing beam splitter 558 in order to focus the difference of the two recombined images.

Second polarization optical branch is similar to first polarization optical branch, and is configured to transmit p-polarized sub-beams 530, 532 and measure any change, shift, and/or deviation in an alignment position of diffraction target 520 in a vertical or "Y" direction, with reference to alignment axis 526. As shown in FIG. 5, first polarization optical branch may include first polarizing filter 568, "Y" direction self-referencing interferometer (SRI-Y) 570, second polarizing filter 572, and polarizing beam splitter 574. P-polarized sub-beams 530, 532 transmit through first polarizing filter 568, SRI-Y 570, and second polarizing filter 572 in order. In some embodiments, first and second polarizing filters 568, 572 can each be a waveplate, for example, a half-wave plate at 22.5° ($\pi/8$). In some embodiments, first and second polarizing filters 568, 572 can each be a waveplate, for example, a quarter-wave plate at 45° ($\pi/4$).

First polarizing filter 568, SRI-Y 570, and second polarizing filter 572 are configured to rotate an image of p-polarized sub-beams 530, 532 by 180° and recombine the two images, which are 180° out of phase with the other. The two recombined images are transmitted to polarizing beam splitter 574. Polarizing beam splitter 574 is configured to separate and transmit the difference between the two recombined images into third position detector 582 and the sum of the two recombined images into fourth position detector 580. As shown in FIG. 5, focusing lens 578 can be included in second polarization optical branch in order to focus the sum of the two recombined images onto fourth position detector 580. In some embodiments, an additional focusing lens, similar to focusing lens 578, may be included between third position detector 582 and polarizing beam splitter 574 in order to focus the difference of the two recombined images.

As shown in FIG. 5, detector controller 584 can be connected to first position detector 566, second position detector 564, third position detector 582, and fourth position detector 580 via first, second, third, and fourth control signals 586, 585, 588, 587, respectively. Detector controller 584 is configured to measure and detect an alignment position of diffraction target 520, with reference to alignment axis 526, based on the signal beams (e.g., difference and sum) outputted from the first and second polarization branches. In some embodiments, detector controller 584 is configured to measure any change, shift, and/or deviation in an alignment position of diffraction target 520 in a horizontal or "X" direction and/or in a vertical or "Y" direction. In some embodiments, detector controller 584 can combine second and third diffraction order sub-beams 530, 532 to generate a sinusoidal phase.

One or more optical filters may be disposed along an illumination path of illumination beam 504 and/or signal path 535 of second and third diffraction order sub-beams 530, 532. As discussed above, when an optical filter is disposed along the illumination path and/or signal path 535, one or more physical parameters of illumination beam 504 and/or sub-beams 530, 532 along signal path 535 is adjusted, and a change or shift in alignment position of diffraction target 520 from a reference alignment position occurs (e.g., calibrated diffraction target 520 on substrate 522).

As shown in FIG. 5, one or more optical filters may include spectral filter 506, numerical aperture (NA) filter 508, neutral density (ND) filter 510, patterned filter 512, and/or polarizing filter 514 disposed along an illumination path of illumination beam 504 and/or signal path 535. In some embodiments, spectral filter 506 can include a bandpass filter, a bandpass interference filter, a notch filter, a shortpass filter, a longpass filter, a step filter, and/or a dichroic filter. In some embodiments, NA filter 508 can include a lens, an objective, and/or a prism configured to change an optical power and/or beam shape of illumination beam 504 and/or sub-beams 530, 532 along signal path 535. In some embodiments, ND filter 510 can be configured to change an intensity and/or spot size of illumination beam 504 and/or sub-beams 530, 532 along signal path 535. In some embodiments, patterned filter 512 can include a patterned reticle and/or reference pattern disposed in illumination beam 504 and/or sub-beams 530, 532 along signal path 535. In some embodiments, polarizing filter 514 can include a waveplate disposed in illumination beam 504 and/or sub-beams 530, 532 along signal path 535. For example, polarizing filter 514 can be a half-wave plate or a quarter-wave plate.

In some embodiments, as shown in FIG. 5, one or more optical filters 506, 508, 510, 512, 514 can be disposed in illumination beam 504 and/or sub-beams 530, 532 along signal path 535 at various positions, including but not limited to optical filter 538, optical filter 544, optical filter 548, optical filter 560, and/or optical filter 576. For example, optical filter 538 can be a waveplate. For example, optical filter 560 can be a patterned reticle and/or reference pattern. For example, optical filter 544 can be a patterned reticle and/or reference pattern.

Processor 590 is coupled to detector controller 584 via control signal 592. Processor 590 is configured to measure a change and/or shift in an alignment position of diffraction target 520 caused by one or more optical filters 506, 508, 510, 512, 514, 538, 544, 548, 560, 576. Processor 590 receives measured alignment position values from detector controller 584 to calculate a reference (i.e., calibrated) alignment position for diffraction target 520. When one or more optical filters 506, 508, 510, 512, 514, 538, 544, 548, 560, 576 is disposed in illumination beam 504 and/or sub-beams 530, 532 along signal path 535, processor 590 receives a subsequent (i.e., modified) alignment position for diffraction target 520 and calculates any change between the two measured alignment positions. Based on the change, processor 590 determines a sensor response function of alignment sensor apparatus 500. Processor 590 can be configured to correct an APE of alignment sensor apparatus 500 based on the sensor response function. In some embodiments, processor 590 can configured to correct an APE by calculating a derivative and/or a minimum value of the sensor response function for one or more physical parameters. In some embodiments, the sensor response function is calculated by processor 590 based on a linear model. In some embodiments, the sensor response function is calculated by processor 590 based on a non-linear model.

In an embodiment, after detector controller 584 and/or processor 590 determines a reference (i.e., calibrated) alignment position for diffraction target 520, spectral filter 506 is disposed in illumination beam 504 and/or sub-beams 530, 532 along signal path 535 to adjust one or more physical parameters. Processor 590 is configured to determine the sensor response function based on the change between different wavelengths of illumination beam 504 and/or sub-beams 530, 532 along signal path 535. For example, illumination beam 504 can have an initial wavelength ($\lambda$) of 700 nm. A first alignment position (e.g., reference alignment position) of diffraction target 520 is measured at $\lambda_0=700$ nm to be $x_0=0$ nm. Spectral filter 506, for example, a notch filter, adjusts the wavelength of illumination beam 504 from 700 nm to 710 nm, and a second alignment position of diffraction target 520 is measured at $\lambda_1=710$ nm to be $x_1=4$ nm. Assuming APE is a linear function of wavelength, a sensor response function based on the change between different wavelengths is calculated by processor 590, such that the sensor response function is $\Delta x/\Delta\lambda=(4\text{ nm}-0\text{ nm})/(710\text{ nm}-700\text{ nm})=0.4$ or APE=$(0.4)\cdot\Delta\lambda$.

In an embodiment, after detector controller 584 and/or processor 590 determines a reference (i.e., calibrated) alignment position for diffraction target 520, NA filter 508 is disposed in illumination beam 504 and/or sub-beams 530, 532 along signal path 535 to adjust one or more physical parameters. Processor 590 is configured to determine the sensor response function based on the change between one or more different diffraction order sub-beams 528, 530, 532 along signal path 535. For example, illumination beam 504 can have an initial NA of 1.35. A first alignment position (e.g., reference alignment position) of, for example, third diffraction order sub-beam 532 is measured at NA 0=1.35 to be $x_0=0$ nm. NA filter 508 adjusts the NA of illumination beam 504 from 1.35 to 1.20, and a second alignment position of third diffraction order sub-beam 532 is measured at $NA_1=1.20$ to be $x_1=3$ nm. Assuming APE is a linear function of diffraction order sub-beams, a sensor response function based on the change between different diffraction order-sub-beams is calculated by processor 590, such that the sensor response function is $\Delta x/\Delta NA=(3\text{ nm}-0\text{ nm})/(1.35-1.20)=20$ or APE=$(20)\cdot\Delta NA$ (nm).

In an embodiment, after detector controller 584 and/or processor 590 determines a reference (i.e., calibrated) alignment position for diffraction target 520, polarizing filter 514 is disposed in illumination beam 504 and/or sub-beams 530, 532 along signal path 535 to adjust one or more physical parameters. processor 590 is configured to determine the sensor response function based on the change between different polarizations of illumination beam 504 and/or sub-beams 530, 532 along signal path 535. For example, illumination beam 504 can have an initial linear polarization ($\theta$) of 30°. A first alignment position (e.g., reference alignment position) of diffraction target 520 is measured at $\theta_0=30°$ to be $x_0=5$ nm. Polarizing filter 514 adjusts the polarization of illumination beam 504 from 30° to 45°, and a second alignment position of diffraction target 520 is measured at $\theta_1=45°$ to be $x_1=8$ nm. Assuming APE is a linear function of polarization, a sensor response function based on the change between different polarizations is calculated by processor 590, such that the sensor response function is $\Delta x/\Delta\theta=(8\text{ nm}-5\text{ nm})/(45°-30°)=0.2$ or APE=$(0.2)\cdot\Delta\theta$ (nm/°).

In some embodiments, alignment sensor apparatus 500 can include beam analyzer 536 and/or mark asymmetry reconstruction (MAR) optical branch 540. In some embodiments, as shown in FIG. 5, MAR optical branch 540 can be disposed between spot mirror 516 and polarizing beam splitter 550. MAR optical branch 540 is configured measure and determine asymmetries in diffraction target 520. MAR optical branch 540 can include beam splitter 542 and MAR detector 546. Beam splitter 542 reflects a portion of sub-beams 530, 532 along signal path 535 and transmits a remaining portion of sub-beams 530, 532 along signal path 535 toward polarizing beam splitter 550. In some embodiments, as shown in FIG. 5, MAR optical branch 540 can include optical filter 544. For example, optical filter 544 can be a patterned reticle and/or reference pattern. In some embodiments, MAR detector 546 is coupled to beam analyzer 536 via control signal 598. For example, MAR detector 546 can receive and incorporate reference values for various parameters of illumination beam 504, 534 and/or first diffraction order sub-beam 528 measured by beam analyzer 536, and optimize the asymmetries detected for diffraction target 520 based on these reference values In some embodiments, processor 590 is coupled to beam analyzer 536 via control signal 596. For example, processor 590 can receive and incorporate reference values for various parameters of illumination beam 504, 534 and/or first diffraction order sub-beam 528 measured by beam analyzer 536, and optimize the alignment position and/or sensor response function based on these reference values. In some embodiments, processor 590 is coupled to MAR detector 546 via control signal 594. For example, processor 590 can receive and incorporate asymmetry values of diffraction target 520 measured by MAR detector 546, and optimize the alignment position and/or sensor response function based on these asymmetry values.

According to some embodiments, processor 590 can be configured to measure the intensity and intensity imbalance of the diffracted order from the alignment sensor. To avoid the costly implementation of additional detectors, power splitters, etc., an embodiment of the present disclosure provides an optical blocking element 599 to be placed before the diffracted orders, e.g., before polarizing beam splitter 550 that splits the signal path 535 into orthogonal polarization components (i.e., first and second polarization optical branches). In one example, measuring and analyzing intensity imbalances can enable determination of mark deformation and correct for it.

According to some embodiments, blocking optical element 599 may be a rotating shutter, an optical chopper, a movable mirror, a MEMS mirror, a MEMS shutter, a digital micro mirror device (DMD) or the like. Blocking optical element 599 may be utilized to measure phase and intensity sequentially, which allows for scanning the desired mark three times, one time for phase, and two times for the intensity of each channel. Alternatively, the scanning speed may be reduced by three fold to measure the phase and intensity sequentially. In this regard, a switch may be placed in front of the detector first position detector 580 and second position detector 564.

According to some embodiments, an integrated optics configuration may be implemented, based on self-referencing concept. For example, an electro absorption optical modulator or a wide band optical switch may be used that allows one channel to deliver enough light to the on chip interferometer at time and alternate between the channels sequentially using an electric circuit.

According to some aspects, alignment sensor apparatus 500 can receive a first scattered beam (e.g., beam 530) and a second scattered beam (e.g., beam 532) of radiation from the target structure, wherein the first scattered beam comprises a first non-zero diffraction order and the second scattered beam comprises a second non-zero diffraction order that is different from the first non-zero diffraction order. Alignment sensor apparatus 500 can also include optical blocking element 599 that directs the first scattered beam towards an imaging detector (e.g., detectors 564 and 580) and blocking the second scattered beam, then directs the second scattered beam towards the imaging detector and blocking the first scattered beam. Additionally, the imaging detector determines a first intensity signal of the first scattered beam, determines a second intensity signal of the second scattered beam, and generates a detection signal corresponding to a difference between the first intensity signal and the second intensity signal. Additionally, processor 590 can determine a property of the target structure based on at least the detection signal. Such properties may include, but are not limited to, alignment of a reticle, and/or alignment of the pattern transferred onto the reticle.

In some embodiments, use of blocking element 599 may lead to a generation of a DC signal, from which an AC component would need to be isolated. According to some aspects, alignment sensor apparatus 500 can include an optical modulating element (ME) that modulates the first scattered beam to isolate an AC component of the first scattered beam. ME may also modulate the second scattered beam to isolate an AC component of the second scattered beam. As such, the imaging detector may measure the first and second intensity signals based on the AC components of the first and second scattered beams.

According to some aspects, properties of the target structure may include alignment mark symmetry and alignment position. According to some aspects, the phase adjustment may be determined, in part, on the determined property of the target structure.

Implementations of the present configuration of alignment sensor apparatus 500 provide for a multitude of benefits in both, performance, and configuration. For example, such implementation is much simpler and cost effective compared with current scheme for implementing the intensity channel, which requires the use of additional detectors and optical elements. For example, current systems require the use of power splitter in each channel and two additional detection systems with 2 DMUX, which also need to be calibrated together to insure similar performance of the 3 systems, one for the phase, and two for the intensity measurements. This is not required by the present implementation as the detector infrastructure can remain the same and would only need to be calibrated once. Additionally, the signal may be provided in both polarizations (S & P) at the same time which reduces polarization cross talk. Additional benefits include the reduced need for calibration of the detectors and demultiplexers.

Figure 6:
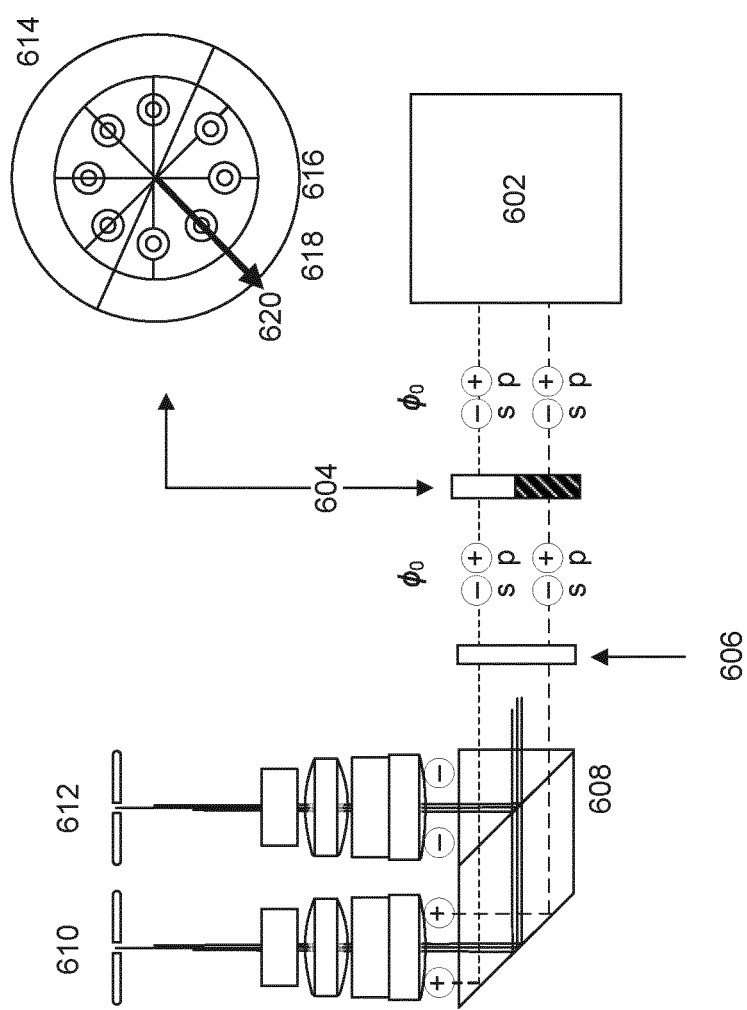
FIG. 6 shows a layout of polarization states using a half wave plate and a switchable half wave plate, according to some embodiments.
Figure 7:
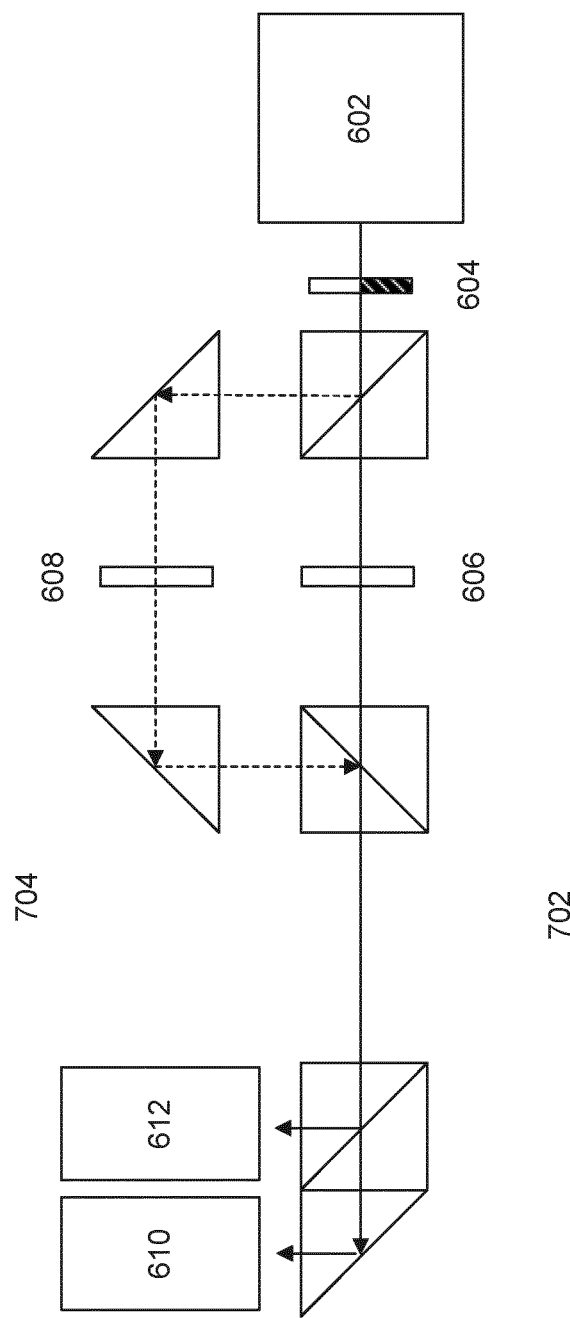
FIG. 7 shows a polarization optics assembly configured to detect intensity and phase channel signals simultaneously, according to some embodiments.
Figure 8:
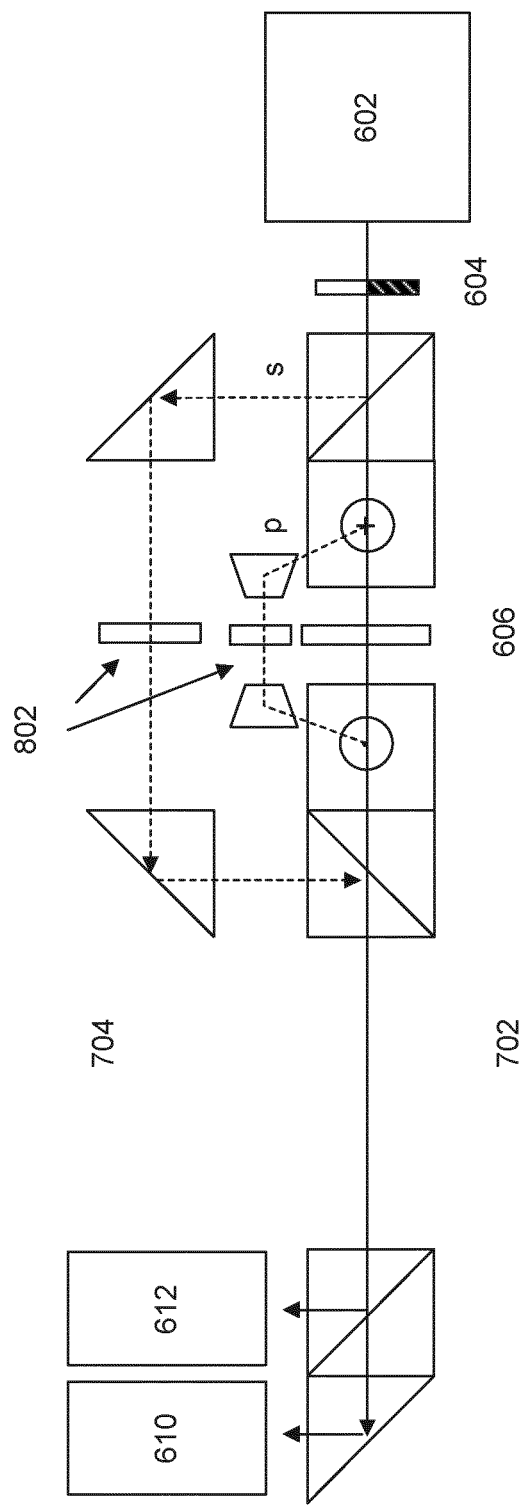
FIG. 8 shows a polarization optics assembly configured to detect intensity and phase channel signals simultaneously, according to some embodiments.

FIGS. 6-8 describe features of configuring the positive (SUM) and negative (DIFF) channel outputs to detect intensity signals from positive and negative diffraction orders separately within a polarization optics assembly (POA). According to some aspects, the polarization assignment of positive and negative orders may be made opposite each other (e.g., s polarization for + order and p polarization for − order). According to some aspects, a half-wave plate may be placed after the source and can be configured to switch the polarization for half of the pupil, and thus, assign a different s and p polarization for each sign of diffraction orders. According to some aspects, POA can then separate orthogonal polarizations whereby positive and negative diffraction orders will be directed into SUM and DIFF channel output fibers. A demultiplexer can later separate all colors and a detector can detect intensity signals.

FIG. 6 illustrates a layout of polarization states using a half wave plate and a switchable half wave plate. FIG. 6 includes a polarization optics assembly that may include a source 602, a half-half wave plate (half-HWP) 604, a switchable HWP 606, a polarizing beam splitter 608 that generates a SUM channel 610 and a DIFF channel 612. According to some aspects, in order to preserve the phase channel functionality, switchable HWP 606 can be inserted into the path to generate interference. For example, switchable HWP 606 can be oriented at 22.5°, which can switch the functionality of detection from phase detection to intensity detection, sequentially.

According to some aspects, FIG. 7 illustrates a POA configured to detect intensity and phase channel signals simultaneously. According to some aspects, the intensity signal can first be separated into a second path 704 that is parallel to phase path 702 with an intensity modulated element (modulator 708). According to some aspects, the output signal can have an additional harmonic as a result of the intensity modulation and this unique frequency can be demodulated to detect intensity imbalance. According to some aspects, the POA will deploy non-polarizing beam splitters (including non-polarizing beam splitter 710) to split and recombine the beam.

Figure 9:
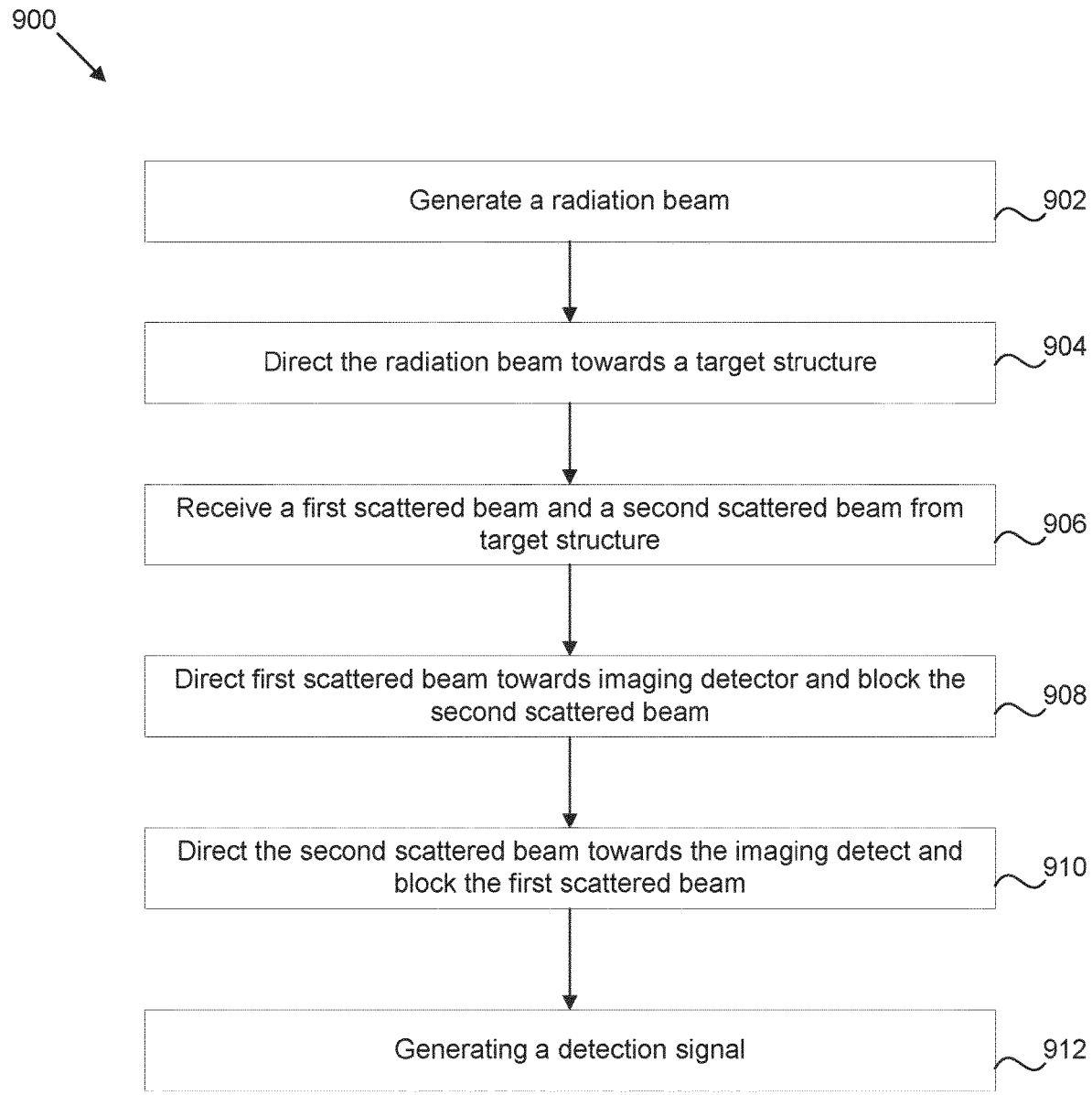
FIG. 9 shows method steps for performing functions related to detecting intensity and phase channel signals, according to some aspects.

FIG. 9 shows method steps for performing functions described herein, according to some embodiments. The method steps of FIG. 9 can be performed in any conceivable order and it is not required that all steps be performed. Moreover, the method steps of FIG. 9 described below merely reflect an example of steps and are not limiting. That is, further method steps and functions may be envisaged based upon embodiments described in reference to FIGS. 1-8.

The method includes generating a radiation beam, as illustrated in step 902. Method 900 further includes directing the radiation beam towards a target structure, as illustrated in step 904. Method 900 further includes receiving a first scattered beam and a second scattered beam of radiation from the target structure, as illustrated in step 906, wherein the first scattered beam comprises a first non-zero diffraction order and the second scattered beam comprises a second non-zero diffraction order that is different from the first non-zero diffraction order. Method 900 further includes directing the first scattered beam towards an imaging detector and blocking the second scattered beam, as illustrated in step 908. Moreover, method 900 also includes determining a first intensity signal corresponding to the first scattered beam at the imaging detector, as illustrated in step 910. At step 912, method 900 includes performing the same procedure for the directing the second scattered beam and determining a second intensity signal corresponding to the second scattered beam at the imaging detector. At the imaging detector, method 900 can further include generating a detection signal corresponding to a different between the first intensity signal and the second intensity signal, and determining a property of the target structure based on at least the detection signal.

The embodiments may further be described using the following clauses:

1. A metrology detection method comprising:
    generating a radiation beam;
    directing the radiation beam toward a target structure;
    receiving a first scattered beam and a second scattered beam of radiation from the target structure, wherein the first scattered beam comprises a first non-zero diffraction order and the second scattered beam comprises a second non-zero diffraction order that is different from the first non-zero diffraction order;
    directing the first scattered beam towards an imaging detector and blocking the second scattered beam;
    determining a first intensity signal corresponding to the first scattered beam at the imaging detector;
    directing the second scattered beam towards the imaging detector and blocking the first scattered beam;

determining a second intensity signal corresponding to the second scattered beam at the imaging detector;

generating, at the imaging detector, a detection signal corresponding to a difference between the first intensity signal and the second intensity signal; and determining a property of the target structure based on at least the detection signal.

2. The metrology detection method of clause 1, further comprising:

modulating the first scattered beam to isolate a first AC component of the first scattered beam; and measuring the first intensity signal based on the first AC component.

3. The metrology detection method of clause 1, further comprising:

modulating the second scattered beam to isolate a second AC component of the second scattered beam; and measuring the second intensity signal based on the second AC component.

4. The metrology detection method of clause 1, further comprising:

producing or adjusting a phase difference of the first and second scattered beams; and interfering the first and second scattered beams at the imaging detector.

5. The metrology detection method of clause 4, further comprising:

generating a second detection signal based on the adjusted phase difference; and determining a property of the target structure based on the first detection signal and the second detection signal.

6. The metrology detection method of clause 1, wherein the determining the property of the target structure comprises determining an alignment mark symmetry.

7. The metrology detection method of clause 5, wherein the determining the property of the target structure comprises determining an alignment position.

8. The metrology detection method of clause 4, wherein the producing or adjusting the phase difference is performed, in part, on the determined property of the target structure.

9. The metrology detection method of clause 8, wherein the determining comprises determining an alignment mark symmetry.

10. The metrology detection method of clause 1, wherein blocking the first scattered beam and blocking the second scattered beam is achieved by rotating a shutter apparatus.

11. The metrology detection method of clause 1, wherein the blocking of the first scattered beam and the blocking of the second scattered beam is achieved using a mirror array.

12. A metrology system comprising:

a radiation source configured to generate a radiation beam;

an optical system configured to direct the radiation beam toward a target structure, and receive a first scattered beam and a second scattered beam of radiation from the target structure, wherein the first scattered beam comprises a first non-zero diffraction order and the second scattered beam comprises a second non-zero diffraction order that is different from the first non-zero diffraction order;

an optical element configured to direct the first scattered beam towards an imaging detector and blocking the second scattered beam, direct the second scattered beam towards the imaging detector and blocking the first scattered beam;

wherein the imaging detector is configured to determine a first intensity signal of the first scattered beam, determine a second intensity signal of the second scattered beam, and generate a detection signal corresponding to a difference between the first intensity signal and the second intensity signal; and a processor configured to determine a property of the target structure based on at least the detection signal.

13. The metrology system of clause 12, further comprising:

an optical modulating element configured to modulate the first scattered beam to isolate a first AC component of the first scattered beam; and wherein the imaging detector is further configured to measure the first intensity signal based on the first AC component.

14. The metrology system of clause 12, further comprising:

an optical modulating element configured to modulate the second scattered beam to isolate a second AC component of the first scattered beam; and wherein the imaging detector is further configured to measure the second intensity signal based on the second AC component.

15. The metrology system of clause 12, further comprising:

a second optical element configured to interfere the first and second scattered beams at an imaging detector.

16. The metrology system of clause 15, wherein the imaging detector is further configured to generate a second detection signal based on the adjusted phase difference; and determine a property of the target structure based on the first detection signal and the second detection signal.

17. The metrology system of clause 12, wherein the property of the target structure comprises an alignment mark symmetry.

18. The metrology system of clause 16, wherein the property of the target structure comprises an alignment position.

19. The metrology system of clause 16, wherein the imaging detector is further configured to determine the phase adjustment, in part, on the determined property of the target structure.

20. The metrology system of clause 19, wherein the determined property is an alignment mark symmetry.

21. The metrology system of clause 12, wherein optical element is a rotating shutter.

22. The metrology system of clause 12, wherein the optical element is a MEMS mirror.

23. The metrology system of clause 14, wherein the optical modulating element is an optical chopper.

24. A lithographic apparatus comprising:

an illumination system configured to illuminate a pattern of a patterning device;

a projection system configured to project an image of the pattern onto a substrate; and metrology system comprising:
a radiation source configured to generate a radiation beam;
an optical system configured to
  direct the radiation beam toward a target structure, and
  receive a first scattered beam and a second scattered beam of radiation from the target structure, wherein the first scattered beam comprises a first non-zero diffraction order and the second scattered beam comprises a second non-zero diffraction order different from the first non-zero diffraction order;
an optical element configured to
  direct the first scattered beam towards an imaging detector and blocking the second scattered beam,
  direct the second scattered beam towards the imaging detector and blocking the first scattered beam;
an imaging detector configured to
  determine a first intensity signal of the first scattered beam,
  determine a second intensity signal of the second scattered beam, and
  generate a detection signal corresponding to a difference between the first intensity signal and the second intensity signal; and
a processor configured to determine a property of the target structure based on at least the detection signal.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the present disclosure in the context of optical lithography, it will be appreciated that the present disclosure can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The terms "radiation," "beam," "light," "illumination," and the like as used herein may encompass all types of electromagnetic radiation, for example, ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the present disclosure in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the disclosure have been described above, it will be appreciated that embodiments of the present disclosure may be practiced otherwise than as described. The descriptions are intended to be illustrative, not limiting. Thus it will be apparent to one skilled in the art that modifications may be made to the disclosure as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the protected subject matter should not be limited by any of the above-described exemplary embodiments, but should be defined only in accordance with the following claims and their equivalents.

The invention claimed is:

1. A metrology detection method comprising:
generating a radiation beam;
directing the radiation beam toward a target structure to generate first and second scattered beams of radiation from the target structure, wherein the first and second scattered beams comprise respective first and second non-zero diffraction orders, the second non-zero diffraction order being different from the first non-zero diffraction order;
receiving the first scattered beam and the second scattered beam of radiation from the target structure;
directing the first scattered beam towards an imaging detector and blocking the second scattered beam using a blocking optical element;
determining a first intensity signal corresponding to the first scattered beam at the imaging detector;
directing the second scattered beam towards the imaging detector and blocking the first scattered beam using the blocking optical element;
determining a second intensity signal corresponding to the second scattered beam at the imaging detector;
generating, at the imaging detector, a detection signal corresponding to a difference between the first intensity signal and the second intensity signal; and
determining a property of the target structure based on at least the detection signal.

2. The metrology detection method of claim 1, further comprising:
modulating the first scattered beam to isolate a first AC component of the first scattered beam; and
measuring the first intensity signal based on the first AC component.

3. The metrology detection method of claim 1, further comprising:
modulating the second scattered beam to isolate a second AC component of the second scattered beam; and
measuring the second intensity signal based on the second AC component.

4. The metrology detection method of claim 1, further comprising:
producing or adjusting a phase difference of the first and second scattered beams; and
interfering the first and second scattered beams at the imaging detector.

5. The metrology detection method of claim 4, further comprising:
generating a second detection signal based on the adjusted phase difference; and
determining a property of the target structure based on the first detection signal and the second detection signal.

6. The metrology detection method of claim 1, wherein the determining the property of the target structure comprises determining an alignment mark symmetry.

7. The metrology detection method of claim 5, wherein the determining the property of the target structure comprises determining an alignment position.

8. The metrology detection method of claim 4, wherein the producing or adjusting the phase difference is performed, in part, on the determined property of the target structure.

9. The metrology detection method of claim 8, wherein the determining comprises determining an alignment mark symmetry.

10. The metrology detection method of claim 1, wherein the blocking optical element comprises a rotating shutter apparatus.

11. The metrology detection method of claim 1, wherein the blocking optical element comprises a mirror array.

12. A metrology system comprising:
a radiation source configured to generate a radiation beam;
an optical system configured to:
direct the radiation beam toward a target structure to generate first and second scattered beams of radiation from the target structure, wherein the first and second scattered beams comprise respective first and second non-zero diffraction orders, the second non-zero diffraction order being different from the first non-zero diffraction order, and
receive the first scattered beam and the second scattered beam of radiation from the target structure;
an optical element comprising a blocking optical element, the optical element configured to:
direct the first scattered beam towards an imaging detector and block the second scattered beam using the blocking optical element, and
direct the second scattered beam towards the imaging detector and block the first scattered beam using the blocking optical element;
wherein the imaging detector is configured to:
determine a first intensity signal of the first scattered beam,
determine a second intensity signal of the second scattered beam, and
generate a detection signal corresponding to a difference between the first intensity signal and the second intensity signal; and
a processor configured to determine a property of the target structure based on at least the detection signal.

13. The metrology system of claim 12, further comprising:
an optical modulating element configured to modulate the first scattered beam to isolate a first AC component of the first scattered beam;
wherein the imaging detector is further configured to measure the first intensity signal based on the first AC component.

14. The metrology system of claim 12, further comprising:
an optical modulating element configured to modulate the second scattered beam to isolate a second AC component of the first scattered beam;
wherein the imaging detector is further configured to measure the second intensity signal based on the second AC component.

15. The metrology system of claim 12, further comprising:
a second optical element configured to interfere the first and second scattered beams at an imaging detector.

16. The metrology system of claim 15, wherein the imaging detector is further configured to:
generate a second detection signal based on an adjusted phase difference; and
determine a property of the target structure based on the first detection signal and the second detection signal.

17. The metrology system of claim 12, wherein the property of the target structure comprises an alignment mark symmetry.

18. The metrology system of claim 16, wherein the property of the target structure comprises an alignment position.

19. The metrology system of claim 16, wherein the imaging detector is further configured to determine the phase adjustment, in part, on the determined property of the target structure.

20. A lithographic apparatus comprising:
an illumination system configured to illuminate a pattern of a patterning device;
a projection system configured to project an image of the pattern onto a substrate; and
a metrology system comprising:
a radiation source configured to generate a radiation beam;
an optical system configured to:
direct the radiation beam toward a target structure to generate first and second scattered beams of radiation from the target structure, wherein the first and second scattered beams comprise respective first and second non-zero diffraction orders, the second non-zero diffraction order being different from the first non-zero diffraction order, and
receive the first scattered beam and the second scattered beam of radiation from the target structure;
an optical element comprising a blocking optical element, the optical element configured to:
direct the first scattered beam towards an imaging detector and block the second scattered beam using the blocking optical element, and
direct the second scattered beam towards the imaging detector and block the first scattered beam using the blocking optical element;
an imaging detector configured to:
determine a first intensity signal of the first scattered beam,
determine a second intensity signal of the second scattered beam, and
generate a detection signal corresponding to a difference between the first intensity signal and the second intensity signal; and
a processor configured to determine a property of the target structure based on at least the detection signal.

* * * * *